United States Patent
Schwabe

(10) Patent No.: US 7,639,468 B2
(45) Date of Patent: Dec. 29, 2009

(54) CIRCUIT FOR LOAD CURRENT MEASUREMENT, LIMITATION AND SWITCHING

(75) Inventor: Dietmar Schwabe, Neumark (DE)

(73) Assignee: Siemens Aktiengesellschaft, Munich (DE)

( * ) Notice: Subject to any disclaimer, the term of this patent is extended or adjusted under 35 U.S.C. 154(b) by 76 days.

(21) Appl. No.: 12/082,433

(22) Filed: Apr. 11, 2008

(65) Prior Publication Data
US 2008/0253049 A1    Oct. 16, 2008

(30) Foreign Application Priority Data
Apr. 16, 2007    (EP)    ................... 07007723

(51) Int. Cl.
*H02H 9/08* (2006.01)
(52) U.S. Cl. .................................... 361/93.7; 361/93.9
(58) Field of Classification Search ........ 361/93.7–93.9
See application file for complete search history.

(56) References Cited

U.S. PATENT DOCUMENTS

| | | | |
|---|---|---|---|
| 5,245,523 A | * | 9/1993 | Juzswik ................... 363/56.03 |
| 6,285,177 B1 | | 9/2001 | Mallikarjunaswamy et al. |
| 6,316,967 B1 | | 11/2001 | Takagi et al. |
| 6,922,321 B2 | * | 7/2005 | Katoh et al. ............... 361/93.9 |
| 2003/0169025 A1 | | 9/2003 | Finney |

FOREIGN PATENT DOCUMENTS

DE    102 26 082 A1    1/2004

* cited by examiner

*Primary Examiner*—Danny Nguyen

(57) ABSTRACT

There is described a circuit for measuring, limiting and switching a load current on a load. To achieve a circuit of this type with a high degree of accuracy in the current measurement and with a low dispersion range, it is proposed that a measurement current is generated through a current mirror connected between a first supply line and a load, said measurement current being routed through a measuring resistor and resulting in a measurement voltage which is used for evaluation purposes hereupon. A switching transistor, to which a switching voltage can be applied by way of a resistor, is used to switch the load in a currentless fashion. A limitation of the load current is herewith also achieved by means of the switching transistor and an additional transistor in that when the load current is increased by means of the additional transistor, the voltage at the control electrode of the switching transistor is reduced until a balanced condition is set with a predefinable current value.

5 Claims, 2 Drawing Sheets

CIRCUIT FOR LOAD CURRENT MEASUREMENT, LIMITATION AND SWITCHING

CROSS REFERENCE TO RELATED APPLICATIONS

This application claims priority of European Patent Office application No. 07007723.5 EP filed Apr. 16, 2007, which is incorporated by reference herein in its entirety.

FIELD OF INVENTION

The invention relates to a circuit for measuring, limiting and switching a load current on a load.

BACKGROUND OF INVENTION

A circuit of this type is used in areas where a short circuit and/or overcurrent is measured on a load and the load current is to be limited, while the load is to be able to be switched at the same time in a current-less fashion by way of a binary signal from a controller for instance.

Known circuits of this type achieve the said objects, e.g. by means of optocouplers, with the degree of accuracy here being minimal and the range of dispersion of the measurement being relatively high. In addition, a simultaneous deactivation of the output driver (load) is not possible here and is achieved by deactivating a reference voltage.

SUMMARY OF INVENTION

An object underlying the invention is to improve the aforedescribed circuit such that a high degree of accuracy in the current measurement is achieved with a low range of dispersion.

This object is achieved with a circuit having the features according to an independent claim. A measurement current is generated in a simple fashion through the current mirror connected between the first supply line and the load, said measurement current being routed through by a measuring resistor and resulting in a measurement voltage which is used for evaluation purposes hereupon. A switching transistor, to which a switching voltage can be applied by way of a resistor, is used to switch the load in a currentless fashion. Furthermore, a limitation of the load current is herewith achieved by means of the switching transistor and a further transistor such that with an increased load current by means of the additional transistor, the voltage at the control electrodes of the switching transistor is reduced until a balanced condition is set with a definable current value. The precise functionality is described on the basis of the exemplary embodiment illustrated in FIG. 1.

The overcurrent limitation is independent of the operating voltage and can be easily adapted to other conditions, such as for instance higher currents. The output of the current value is linear and unipolar. The threshold values for the limitation can be easily adjusted and selected as required. In addition, the load current can be linearly measured until the current limitation is used. The load current can be deactivated at any time irrespective of the use of the current limitation. The solution is inexpensive as it does not use any special modules.

In an advantageous form of the embodiment, an arrangement which is complementary to the described arrangement is used between the second supply line and the load. In this way, a bipolar circuit is achieved, as is necessary if the load resistor is activated alternately with positive and negative potentials. A complementary setup and a setup according to the independent claim is then provided for instance for the positive branch and the negative branch respectively. The solution according to the invention can thus be used in both a unipolar and also bipolar fashion.

BRIEF DESCRIPTION OF THE DRAWINGS

The invention is described and explained in more detail below with reference to the exemplary embodiments illustrated in the Figures, in which.

DETAILED DESCRIPTION OF INVENTION

Figure 1:
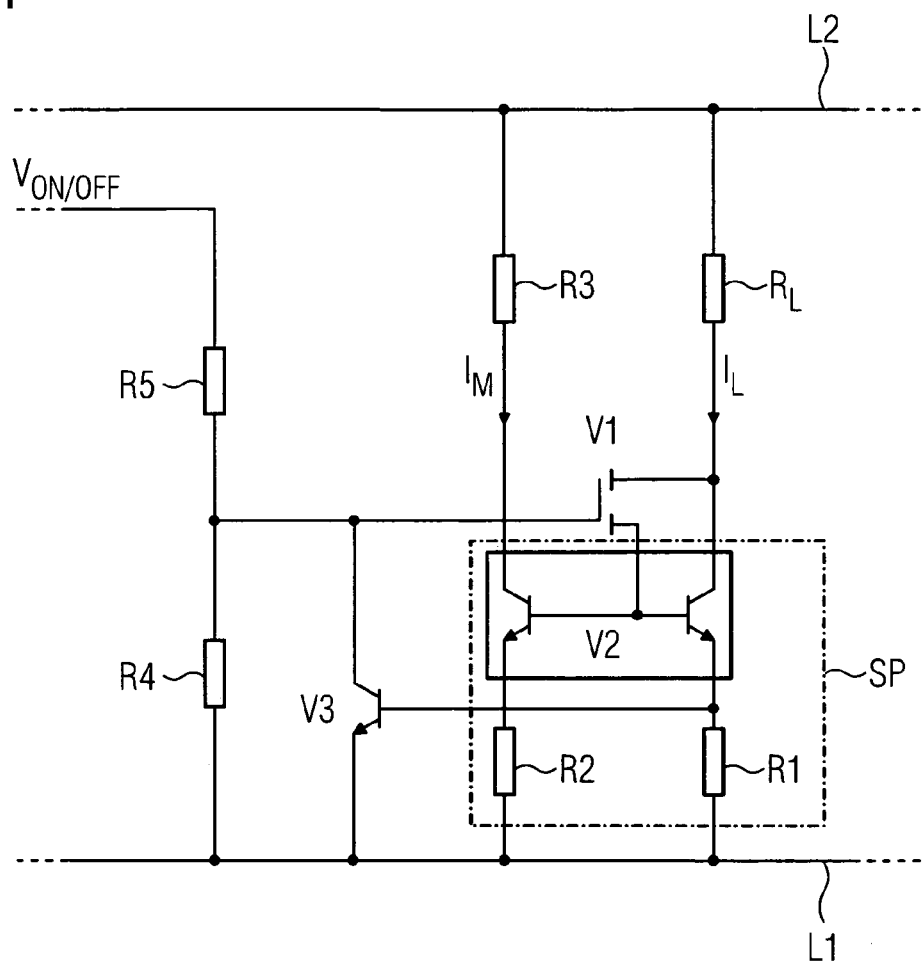
FIG. 1 shows an inventive circuit in a unipolar design and
FIG. 2 shows an inventive circuit in a bipolar design.

FIG. 1 shows a unipolar circuit for measuring, limiting and switching a load $R_L$. In accordance with the invention, the load current $I_L$ is routed by way of a transistor of the double transistor V2 and the resistor R1. If the transistor V1 is switched on (i.e. the gate is positive in respect of source and/or $V_{ON/OFF}$ is so high that the corresponding potential is present at the juncture of R4 and R5), the double transistor operates as a current mirror with the following mirror condition:

$$\frac{I_M}{I_L} = \frac{R1}{R2}.$$

A voltage which is proportional to the measurement current can be measured at R3. An exact adjustment to the desired conditions is thus possible by way of the resistors R1 to R3.

If the load current increases, the voltage drop increases above R1. A current is thus able to flow across the base-emitter path of the transistor V3. This current flow produces a current flow from the collector to the emitter and thus a drop in the voltage at the gate of V1, until a balanced condition is set with the following current:

$$I_L = \frac{V_{BE-V3}}{R1}.$$

Here $V_{BE-V3}$ is the voltage between the base and emitter of the transistor V3. The current through the load resistor can thus be set very precisely as a function of the value dispersions of the used components.

Figure 2:
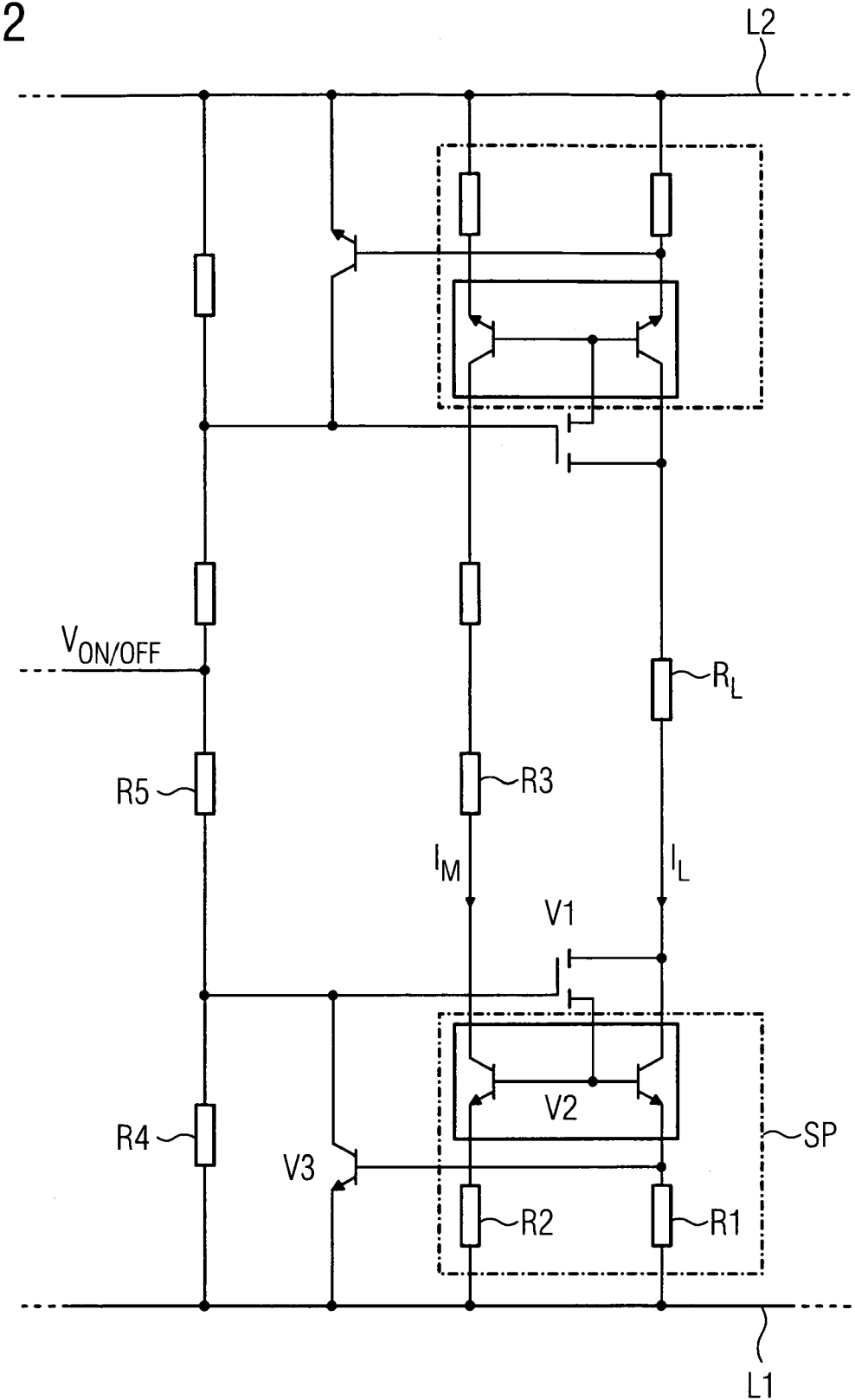

FIG. 2 shows a bipolar circuit for measuring, limiting and switching a load $R_L$. Such a circuit is necessary if the load resistor is controlled alternately with positive and negative potentials. In this case, a circuit which is complementary to the circuit shown in FIG. 1 is inserted between the load $R_L$ and the second supply line L2. The calculation of the complementary part is carried out in a similar manner as in FIG. 1.

In summary, the invention relates to a circuit for measuring, limiting and switching a load current on a load. To achieve a circuit of this type with a high degree of accuracy in the current measurement and with a low dispersion range, it is proposed that a measurement current is generated through a current mirror connected between a first supply line and a load, said measurement current being routed through a measuring resistor and resulting in a measurement voltage which is used for evaluation purposes hereupon. A switching transistor, to which a switching voltage can be applied by way of a resistor, is used to switch the load in a currentless fashion. A limitation of the load current is herewith also achieved by means of the switching transistor and a further transistor, in that in the event of an increased load current by means of the further resistor, the voltage at the control electrode of the switching transistor is reduced until a balanced condition is set with a definable current value.

The invention claimed is:

1. A circuit for measuring, limiting and switching a load current on a load, comprising:

a first supply line;

a current mirror with a double transistor, a first resistor and a second resistor, which result in a mirrored measurement current according to the condition $$\frac{I_M}{I_L} = \frac{R1}{R2};$$

a switching transistor to control the double transistor;

a measuring resistor, wherein a measurement voltage proportional to the measurement current dropping at the measuring resistor is electrically connected between the double transistor and a second supply line of the load;

a control electrode of the switching transistor electrically connected to the first supply line via a fourth resistor and a transistor connected in parallel to the fourth resistor; and a fifth resistor to apply a switching voltage, wherein the fifth resistor is electrically connected to the control electrode of the switching transistor, and wherein the control electrode of the transistor is electrically connected to the double transistor at a link of the first resistor.

2. The circuit as claimed in claim 1, wherein the current mirror is electrically between the first supply line and the load.

3. The circuit as claimed in claim 1, wherein an arrangement which is complementary to the described arrangement is also between the second supply line and the load.

4. The circuit as claimed in claim 2, wherein an arrangement which is complementary to the described arrangement is also between the second supply line and the load.

5. A circuit for measuring, limiting and switching a load current on a load, comprising:

a first supply line;

a first current mirror having a first double transistor, a first resistor of the first current mirror and a second resistor of the first current mirror, which result in a mirrored measurement current according to the condition $$\frac{I_M}{I_L} = \frac{R1}{R2},$$

wherein the first current mirror is electrically connected to the first supply line and the load;

a second current mirror having a second double transistor, a first resistor of the second current mirror and a second resistor of the second current mirror, which result in a mirrored measurement current according to the condition $$\frac{I_M}{I_L} = \frac{R1}{R2},$$

wherein the first current mirror is electrically connected to a second supply line and the load;

a first switching transistor to control the first double transistor;

a second switching transistor to control the second double transistor;

a measuring resistance, wherein a measurement voltage proportional to the measurement current dropping at the measuring resistance is electrically connected between the first double transistor and the second double transistor;

a first control electrode of the first switching transistor electrically connected to the first supply line via a fourth resistor of the first current mirror and a transistor of the first current mirror connected in parallel to the fourth resistor;

a second control electrode of the second switching transistor electrically connected to the second supply line via a fourth resistor of the second current mirror and a transistor of the second current mirror connected in parallel to the fourth resistor of the second current mirror;

a fifth resistor of the first current mirror to apply a switching voltage, wherein the fifth resistor of the first current mirror is electrically connected to the control electrode of the first switching transistor, and wherein the control electrode of the first transistor is electrically connected to the first double transistor at a link of the first resistor of the first current mirror; and a fifth resistor of the second current mirror to apply the switching voltage, wherein the fifth resistor of the second current mirror is electrically connected to the control electrode of the second switching transistor, and wherein the control electrode of the second transistor is electrically connected to the second double transistor at a link of the first resistor of the second current mirror.

* * * * *